US00RE45442E

(19) United States
(12) Reissued Patent
Shimoda et al.

(10) Patent Number: US RE45,442 E
(45) **Date of Reissued Patent: *Mar. 31, 2015**

(54) MULTIPLE WAVELENGTH LIGHT EMITTING DEVICE, ELECTRONIC APPARATUS, AND INTERFERENCE MIRROR

(75) Inventors: Tatsuya Shimoda, Suwa (JP); Tomoko Koyama, Suwa (JP); Takeo Kaneko, Suwa (JP); Jeremy Henley Burroughes, Godmanchester Cambs (GB)

(73) Assignees: Seiko Epson Corporation, Tokyo (JP); Cambridge Display Technology Limited, Cambridge (GB)

( * ) Notice: This patent is subject to a terminal disclaimer.

(21) Appl. No.: 13/085,129

(22) Filed: Apr. 12, 2011

Related U.S. Patent Documents

Reissue of:
(64) Patent No.: 6,791,261
Issued: Sep. 14, 2004
Appl. No.: 09/980,100
PCT Filed: Jun. 2, 2000
PCT No.: PCT/GB00/02143
§ 371 (c)(1),
(2), (4) Date: Mar. 8, 2002
PCT Pub. No.: WO00/76010
PCT Pub. Date: Dec. 14, 2000

U.S. Applications:
(63) Continuation of application No. 11/520,860, filed on Sep. 14, 2006, now Pat. No. Re. 44,164, which is an application for the reissue of Pat. No. 6,791,261.

(30) Foreign Application Priority Data

Jun. 2, 1999 (GB) ..... 9912850.6

(51) Int. Cl.
*H05B 33/00* (2006.01)

(52) U.S. Cl.
USPC ..... 313/506; 313/112; 313/113; 359/577; 359/584; 359/885

(58) Field of Classification Search
None
See application file for complete search history.

(56) References Cited

U.S. PATENT DOCUMENTS 5,405,710 A 4/1995 Dodabalapur et al.
5,554,911 A * 9/1996 Nakayama et al. ..... 313/504

(Continued)

FOREIGN PATENT DOCUMENTS

EP 0 616 488 A2 9/1994
EP 0 653 902 A1 5/1995

(Continued)

OTHER PUBLICATIONS

Sep. 16, 2011 Office Action issued in U.S. Appl. No. 13/016,767.

(Continued)

*Primary Examiner* — Ashok Patel
(74) *Attorney, Agent, or Firm* — Oliff PLC

(57) ABSTRACT

A multiple wavelength light emitting device is provided wherewith the resonance strength and directivity between colors can be easily adjusted for balance. This light emitting device comprises a light emission means 4 for emitting light containing wavelength components to be output, and a semi-reflecting layer group 2 wherein semi-reflecting layers 2R, 2G, and 2B that transmit some light having specific wavelengths emitted from the light emission means and reflect the remainder are stacked up in order in the direction of light advance in association with wavelengths of light to be output. Light emission regions $A_R$, $A_G$, and $A_B$ are determined in association with the wavelengths of light to be output. The configuration is such that, in the light emission regions, the distances $L_R$, $L_G$ and $L_B$ between a reflecting surface for fight from the light emission means side of the semi-reflecting layers 2R, 2G, and 2B that reflect light output from those light emission regions and a point existing in an interval from the end of the light emitting layer on the semi-reflecting layer group side to the reflecting layer are adjusted so as to have an optical path length at which that light resonates.

22 Claims, 7 Drawing Sheets

(56) References Cited

U.S. PATENT DOCUMENTS

| | | | | |
|---|---|---|---|---|
| 5,608,577 | A | 3/1997 | Eda | |
| 5,682,402 | A | 10/1997 | Nakayama et al. | |
| 5,742,129 | A | 4/1998 | Nagayama et al. | |
| 5,763,064 | A | 6/1998 | Suzuki et al. | |
| 5,874,506 | A * | 2/1999 | Tatsu et al. | 525/340 |
| 5,949,187 | A * | 9/1999 | Xu et al. | 313/504 |
| 6,274,979 | B1 | 8/2001 | Celii et al. | |

FOREIGN PATENT DOCUMENTS

| | | | |
|---|---|---|---|
| EP | 0 683 623 | A1 | 11/1995 |
| EP | 0 756 334 | A2 | 1/1997 |
| EP | 1 052 708 | A2 | 11/2000 |
| JP | A 59-194393 | | 11/1984 |
| JP | A 6-275381 | | 9/1994 |
| JP | 08-250786 | | 9/1996 |
| JP | A 8-248276 | | 9/1996 |
| JP | A 10-133222 | | 5/1998 |
| JP | A 10-153967 | | 6/1998 |
| JP | A 10-163967 | | 6/1998 |
| KR | 1999-0036284 | | 5/1999 |
| WO | WO 93/05413 | | 3/1993 |
| WO | WO 97/07653 | | 2/1997 |
| WO | WO 98/59528 | | 12/1998 |

OTHER PUBLICATIONS

Office Action issued in JP Application No. 2001-502181 on Oct. 14, 2010 (with English translation).

David G. Lidzey et al., "Pixelated Multicolor Microcavity Displays" IEEE Journal of Selected Topics Quantum Electronic, IEEE Service Center, Piscataway, NJ, US, vol. 4, No. 1, Feb. 1998, XP011062343.

Office Action issued in U.S. Appl. No. 11/520,860 on May 11, 2011.

Aug. 3, 2012 Office Action issued in U.S. Appl. No. 11/520,860.

Nakayama et al., "Organic Luminescent Devices with Optical Microcavity Structure", Shingaku Gihou, OME 94-79, Mar. 1995, pp. 7-12. (w/abstract).

Dodabalapur et al., "Physics and applications of organic microcavity light emitting diodes", J. Appl. Phys. 80 (12), Dec. 15, 1996, pp. 6954-6964.

* cited by examiner

MULTIPLE WAVELENGTH LIGHT EMITTING DEVICE, ELECTRONIC APPARATUS, AND INTERFERENCE MIRROR

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*Notice: More than one reissue application has been filed for the reissue of U.S. Pat. No. 6,791,261. The reissue application are application Ser. No. 11/520,860, filed on Sep. 14, 2006, now issued as U.S. Pat. No. Re. 44,164, application Ser. No. 13/016,767, filed on Jan. 28, 2011, now issued as U.S. Pat. No. Re. 43,759, which is a divisional of application Ser. No. 11/520,860, application Ser. No. 13/085,129 (the present application), filed on Apr. 12, 2011, which is a continuation reissue of application Ser. No. 11/520,860.*

*This application is a reissue continuation of application Ser. No. 11/520,860, filed on Sep. 14, 2006, which is an application for reissue of U.S. Pat. No. 6,791,261.*

This invention relates to improvements in a light emitting device capable of emitting multiple colors suitable for application for example in organic electro-luminescence(=EL) devices.

The art of combining a reflective layer with a multi-layer dielectric film wherein layers having differing refractive indexes are alternately stacked, and therewith reflecting light of specific wavelengths is known. In Shingaku Gihou, OME 94-79 (March, 1995), pp 7-12, the concept is set forth of using very small resonance structures based on such multi-layer dielectric films to emit multiple light colors. According to this literature, by adjusting the positions of the light emission layer and the reflective surface where reflection occurs in these very small resonance structures, resonant light can be output having any of the wavelengths contained in the light output by the emission layers.

In Japanese Patent Laid-open No. 275381/1994, for example, a light emitting device having the layer structure illustrated in FIG. 13 is disclosed. This light emitting device comprises a transparent substrate 100, a very small resonance structure 102, a positive electrode 103, a hole transport layer 106, an organic EL layer 104, and negative electrodes 105. The wavelengths are selected by altering each of the thicknesses of the positive electrodes 103.

In the article written by members of Bell laboratory, J. Appl. Phys. 80(12), Dec. 15, 1996, a light emitting device having the layer structure illustrated in FIG. 14 is disclosed. This light emitting device comprises a transparent substrate 100, a very small resonance structure 102, $SiO_2$ film 108, a positive electrode 103, a hole transport layer 106, an organic EL layer 104, and negative electrodes 105. The thicknesses of the negative electrodes 103 are the same, but the optical path lengths are altered, respectively, by an $SiO_2$ layer, to select the resonant light wavelength.

With light emitting devices having the structure set forth in the publicized literature noted above, however, there is a problem in that it is very difficult to design light emitting devices optimized for all of a plurality of wavelengths. In other words, the very small resonance structure and gap adjustment materials are optimized for a specific wavelength dispersion. Wherefore, with a very small resonance structure designed so that it is compatible with one of the plurality of light colors having a range of wavelengths, adequate reflectance cannot be achieved relative to other wavelength dispersions. In a color display apparatus, for example, it is necessary to balance the resonance intensity and color purity of each of the colors R (red), G (green), and B (blue) according to the characteristics of human vision. Such balancing adjustments are difficult with conventional light emitting devices.

That having been said, it is nevertheless very difficult in actual manufacturing practice to make the structure of the multi-layer dielectric film different for each pixel (light emission region) unit, therefor this is a difficult method to realise industrially, and hence an expensive process.

Thereupon, a first object of the present invention is to provide a multiple wavelength light emitting device that is balanced and optimized for a plurality of wavelengths.

A second object of the present invention is to provide a multiple wavelength light emitting device wherewith optimization for a plurality of wavelengths is easy, and the manufacture thereof is easy.

A third object of the present invention is to provide an electronic apparatus capable of emitting light of a plurality of optimized wavelengths.

A fourth object of the present invention is to provide an interference mirror capable of sharpening and emitting a multiple wavelength light spectrum.

An invention that realizes the first object noted above is a multiple wavelength light emitting device for emitting multiple light beams having differing wavelengths, comprising:

1) light emission means for emitting light containing the wavelength components to be output;
2) a reflecting layer positioned in proximity to the light emission means; and
3) a semi-reflecting layer group that is positioned so as to be in opposition with the reflecting layer with the light emission means sandwiched therebetween, wherein semi-reflecting layers that reflect some of the light emitted from the light emission means having specific wavelengths, while transmitting the remainder, are stacked up in order in the direction of light travel corresponding to the light wavelengths to be output.

The present invention is also a multiple wavelength light emitting device that comprises at least two but possibly more light emission regions such that the wavelengths of the output light differ, structured so that the distance between a reflecting surface for light from the light emission means side on the semi-reflecting layers that reflect some of the light output from one of the plurality of light emission regions and a point that exists in the interval from the end of the light emission means on the semi-reflecting layer group side to the reflecting layer is adjusted so that it becomes an optical path length at which light of the wavelength output from that light emission region resonates.

Based on the structure described above, the semi-reflecting layer group is optimized for all light wavelengths that are to be emitted, in any of the light emission regions. By adjusting the distance between the reflecting surface of the semi-reflecting layers for the light from the light emission means side and the point existing in the interval from the end of the semi-reflecting layer group side of the light emission means to the reflecting layer, and preferably the distance between the light emission points within the light emission means and the surface (reflecting surface) on the light emission means side of the reflecting layer, according to the light emission means and reflecting layer used, which optimized light is output is determined. The semi-reflecting layers other than those optimized for light of wavelengths other than those output merely function commonly as semi-transparent layers exhibiting a certain attenuation factor, wherefore it is possible to maintain balance between light of multiple wavelengths.

There is no limitation on the "light emission means," as used here, but it is at least necessary that the wavelength component be generated for the light that one wishes to output. The "reflective layer" should form a flat surface, but it does not necessarily have to have a uniform flat surface. The language "in proximity to" includes cases where there is contact with the light emission means, and cases where the positioning results in a slight gap therebetween. So long as a reflective action is exhibited, this may be something that is not closely and indivisibly connected to the light emission means. The "light emission region" is a domain for outputting light having some wavelength dispersion, and signifies that light of different wavelengths is output in each light emission region. "Wavelength" is inclusive of a wide range of wavelengths, including ultraviolet and infrared radiation in addition to wavelengths in the visible light region. "Semi-reflecting layers" include structures such as half mirrors or polarizing panels in addition to interfering laminar structures wherein multiple film layers having different refractive indexes are stacked in layers. In the case of a very small dielectric-based resonating structure, "reflecting surface" refers to the surface on the side toward the light emission means. "Optical path length" corresponds to the product of the medium's refractive index and thickness.

The specification of the "point existing in the interval from the semi-reflecting layer group side of the light emission means to the surface of the reflecting layer" is for the purpose of adjusting the position in the thickness direction where resonance conditions will be satisfied by the light emission means configuration. Here, the positional relationship in the thickness direction (light axis) is defined, and a plane that emits light or reflects light (in the case of a reflecting layer) is formed by the set of "points" that satisfy the resonance conditions in the light emission means overall. Here, when the point existing in the interval from the end of the light emission means on the semi-reflecting layer group side to the reflecting layer is on the reflecting surface of the reflecting layer, the distance L between the reflecting surface on the light emission means side in the semi-reflecting layer of the plurality of semi-reflecting layers that reflects light of wavelength λ, in the light emission region wherein light of wavelength λ is output, and the point existing in the interval from the end of the semi-reflecting group side in the light emission means to the surface of the reflecting layer is adjusted so as to satisfy the relationship $$L=\Sigma di \qquad \text{Eq. 1}$$

$$\Sigma(ni\cdot di)+m_1\cdot(\Phi/2\pi)\cdot\lambda=m_2\cdot\lambda/2$$

where ni is the refractive index of the i'th substance between the semi-reflecting layer and the light emitting surface, di is the thickness thereof, Φ is the phase shift occurring at the reflecting surface in the reflecting layer, and $m_1$ and $m_2$ are natural numbers. L corresponds to the actual distance, while Σ (ni·di) corresponds to the optical path length. It is a necessary condition for resonance between the semi-reflecting surface and the reflecting surface placed on the side opposite thereto that the sum of the optical path length and the phase shift be a natural multiple of the half-wavelength.

There are also cases where a resonance condition is set, setting the point in the interval from the end of the light emission means on the semi-reflecting layer group side to the reflecting layer as the light emission point in the light emission means. In such cases as this, the distance L between the reflecting surface on the light emission means side in the semi-reflecting layer of the plurality of semi-reflecting layers that reflects light of wavelength λ, in the light emission region wherein light of wavelength λ is output, and the point existing in the interval from the end of the semi-reflecting group side in the light emission means to the surface of the reflecting layer is adjusted so as to satisfy the relationship $$L=\Sigma di \qquad \text{Eq. 2}$$

$$\Sigma(ni\cdot di)=m_2\cdot\lambda/2+(2m_3+1)\cdot\lambda/4$$

where ni is the refractive index of the i'th substance between the reflective surface and the point, di is the thickness thereof, $m_2$ is a natural number, and $m_3$ is an integer greater than 0.

The semi-reflecting layer group here is placed evenly so that multiple types of semi-reflecting layers having differing wavelengths corresponding to the plurality of light wavelengths are not separated by a light emission region. The reflecting surface for the light from the light emission means side of the semi-reflecting layer in the semi-reflecting layer group is in a different position in the thickness direction for each light emission region having a different light emission wavelength.

It is to be preferred that the semi-reflecting layer group be arranged so that the semi-reflecting layer reflecting light of longer wavelength is on the side nearer to the light emitting device. This is because it is harder for light of short wavelength to be reflected by a semi-reflecting layer optimized for light of longer wavelength.

More specifically, the semi-reflecting layers making up the semi-reflecting layer group are configured such that two layers of differing refractive index are stacked up alternately. If we have two semi-reflecting layers having different refractive indexes, for example, and take n1 as the refractive index of one layer, d1 as the thickness thereof, n2 as the refractive index of the other layer, and d2 as the thickness thereof, then, when the wavelength of the light reflected in that semi-reflecting layer is λ and m is made 0 or a natural number, then an adjustment is made to satisfy the relationship $$n\mathbf{1}\cdot d\mathbf{1}=n\mathbf{2}\cdot d\mathbf{2}=(1/4+m/2)\cdot\lambda \qquad \text{Eq. 3}$$

This is an interference condition in this resonance structure. It corresponds to the half-wavelength in one combination of two layers. Reflection occurs when light from a layer of low refractive index is incident on a layer of high refractive index, wherefore it is desirable that the arrangement be high refractive index) layer, low layer, high layer, low layer, etc., stacking from the light emission means.

In the invention that realizes the second object noted above, the distance from the reflecting surface for light from the light emission means side of the semi-reflecting layer closest to the light emission means to a point existing in the interval from the end of the light emission means on the semi-reflecting layer group side to the reflecting layer, and preferably the distance from the light emission point in the light emission means and the surface on the light emission means side of the reflecting layer, according to light emission means and reflecting layer used, are maintained at optical path lengths that satisfy Equations 1 and 2 above. And a gap adjustment layer is comprised, between the semi-reflecting layers, for adjusting the distance between the reflecting surface for light from the light emission means side in a semi-reflecting layer other than the semi-reflecting layer closest to the light emission means and the point existing in the interval from the end of the light emission means on the semi-reflecting layer group side to the reflecting layer. The light emission means can be provided flat, without making the height thereof different in the thickness direction, wherefore the complex process of changing the layer thickness in each light emission region during manufacture can be omitted. The "gap adjustment means" need only exhibit light transmissivity, and may be freely selected from among resins or dielectric materials.

In the present invention, moreover, the distance from the reflecting surface for light from the light emission means side of the semi-reflecting layer closest to the light emission means to a point existing in the interval from the end of the light emission means on the semi-reflecting layer group side to the reflecting layer, and preferably the distance from the light emission point in the light emission means and the surface on the light emission means side of the reflecting layer, according to light emission means and reflecting layer used, are maintained at lengths that satisfy Equations 1 and 2 above. And, in order to adjust the distance between the reflecting surface for light from the light emission means side in a semi-reflecting layer other than the semi-reflecting layer closest to the light emission means and the point existing in the interval from the end of the light emission means on the semi-reflecting layer group side to the reflecting layer, the thickness of one layer, in the laminar structure configuring the semi-reflecting layers wherein layers of different refractive index are stacked up, is altered. The gap is adjusted at the layer at the boundary with the semi-reflecting layer, wherefore the quantity of materials used can be cut back, and it is only necessary, in terms of fabrication process, to control the film thickness when forming the layer the thickness thereof is to be adjusted, so the fabrication process can be omitted. It is preferable that the layer used for adjusting the thickness be the layer of high refractive index that is closest among the semi-reflecting layers to the light emission means.

In one aspect of the light emission means, multiple types of light emission means that emit a relatively large number of light components having wavelengths associated with light emission regions are provided so that they are associated with the light emission regions. This applies to cases where optimal light emitting materials are used which contain the wavelength components for the light output in each light emission region.

In another aspect of the light emission means, light emission means are provided, common to each light emission region, capable of emitting light including all components of wavelengths associated with the light emission regions. If light emitting materials can be used which contain all of the light wavelength components to be output, then there is no need to prepare different light emitting material in each light emitting region.

In concrete terms, the light emission means may comprise an organic electro-luminescence layer sandwiched between electrode layers, wherein the electrode provided at the back surface thereof corresponds to the reflection layer. In an organic electro-luminescence layer such as this, there are cases where the point where the electric field reaches maximum between the electrodes coincides with the light emission point in the light emitting layer. It is preferable here that the light emission means be provided with a hole transport layer on the side toward the positive electrode. The light emission means may also be provided with an electron transport layer on the side of the organic electro-luminescence layer toward the negative electrode.

When an organic electro-luminescence device is used, the distance between the reflecting surface for light from the light emission means side of the semi-reflecting layers and a point existing in the interval from the end of the light emission means on the semi-reflecting layer side to the reflecting layer is adjusted by the thickness of the positive electrode located on the semi-reflecting layer group side of the light emission means.

When an organic electro-luminescence device is used, moreover, a layer for adjusting the distance between the reflecting surface for light from the light emission means side of the semi-reflecting layers and a point existing in the interval from the end of the light emission means on the semi-reflecting layer side to the reflecting layer (such as a hole transport layer) may be provided on the side of the light emission means toward the semi-reflecting layer group.

The negative electrode is configured of a material exhibiting light reflectance. If some degree of light reflectance is exhibited, then it can be used as a reflecting surface for the semi-reflecting layer.

When the configuration is made to enable light emission by the light emission region, at least one or other of the electrode films sandwiching the organic electro-luminescence layers is formed separately and independently in correspondence with the light emission region. If one or other of the electrode layers is separated, an active matrix drive configuration is formed, whereas if both electrodes are separated, a passive matrix drive configuration is formed.

In terms of a concrete aspect, it is desirable that the electrodes be separated by a partitioning material and, if necessary, that the organic electro-luminescence layer also be partitioned off. Such a partitioning material would consist of an insulator material.

In another possible aspect, of the electrode films, the negative electrode is made to correspond to the light emission region and separated, while the positive electrode, in order to adjust the distance from the reflecting surface for light from the light emission means side of the semi-reflecting layer closest to the light emission means to a point existing in the interval from the end of the light emission means on the semi-reflecting layer group side to the reflecting layer, has the thickness thereof changed and made to correspond to the light emission region.

In yet another possible aspect, of the electrode films, the positive electrode is made to correspond to the light emission region and separated, and also, in order to adjust the distance from the reflecting surface for light from the light emission means side of the semi-reflecting layer closest to the light emission means to a point existing in the interval from the end of the light emission means on the semi-reflecting layer group side to the reflecting layer, has the thickness thereof changed and made to correspond to the light emission region.

When such independent electrodes are provided, drive circuits are provided separately for driving the electrically separated electrode films.

An invention that realizes the third object noted above is an electronic apparatus that is equipped with the multiple wavelength light emitting device of the present invention, as described in the foregoing. One possible concrete aspect thereof is an electronic apparatus that functions as a display element, configured such that the light emission regions in the multiple wavelength light emitting device are formed as pixels for displaying images, and such that the drive of each pixel can be controlled in response to pixel information.

An invention that realizes the fourth object noted above is an interference mirror, configured so as to be able to partially reflect light of mutually differing wavelengths, and comprising a plurality of interference reflecting layers arrayed sequentially in the optical axis direction, and gap adjustment layers positioned between the interference reflecting layers.

Embodiments of the present invention will now be described by way of further example only and with reference to the accompanying drawings; in which.

Embodiment 1

Figure 1:
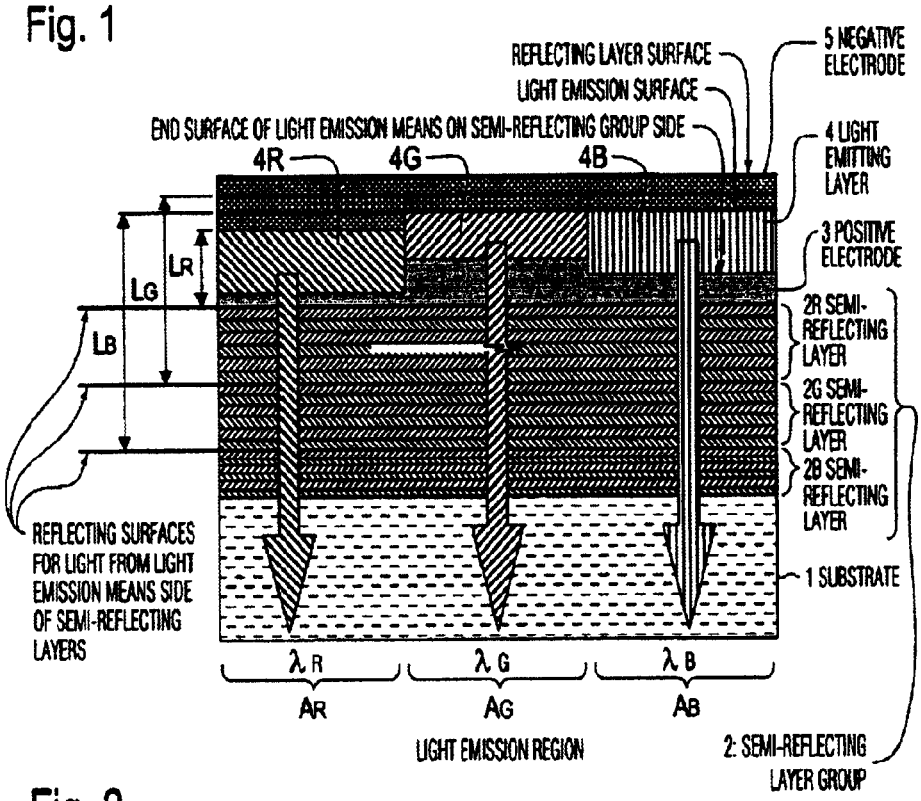
FIG. 1 is a cross-sectional diagram of the layer structure of a multiple wavelength light emitting device in a first embodiment of the present invention.

The first embodiment of the present invention pertains to a basic structure in a case where three basic colors of light can be emitted, as necessary for a color display, and gap adjustments are made with the positive electrode. The layer structure of the multiple wavelength light emitting device in the first embodiment is illustrated in FIG. 1. This multiple wavelength light emitting device, as depicted in FIG. 1, comprises a substrate 1, a semi-reflecting layer group 2, a positive electrode 3, a light emitting layer 4, and a negative electrode 5.

The substrate 1, which serves as the base during fabrication, is made of a material that exhibits light transmissivity and certain mechanical strengths, and that can withstand heat treatment during fabrication. Such materials as glass, quartz, or resins are suitable for this substrate.

The semi-reflecting layer group 2 is configured by a stack of semi-reflecting layers 2R, 2G, and 2B, optimized for light of a certain wavelength. The semi-reflecting layer 2R is optimized to interfere with a red emitted light wavelength (in vicinity of 625 nm). The semi-reflecting layer 2G is optimized to interfere with a green emitted light wavelength (in vicinity of 525 nm). And the semi-reflecting layer 2B is optimized to interfere with a blue emitted light wavelength (in vicinity of 450 nm). The semi-reflecting layers are arrayed with the semi-reflecting layer 2R that resonates with light of longer wavelength (red) placed on the side closer to the light emitting layer 4, the semi-reflecting layer 2G that resonates with light of a shorter wavelength (green) placed below that (lower down in FIG. 1), and with the semi-reflecting layer 2B that resonates with light of the shortest wavelength (blue) placed below that. It is difficult for light of short wavelength to be reflected by a semi-reflecting layer optimized for light of a longer wavelength. Thus, by ordering the layers in this way, a more efficient light emitting device can be configured.

Figure 2:
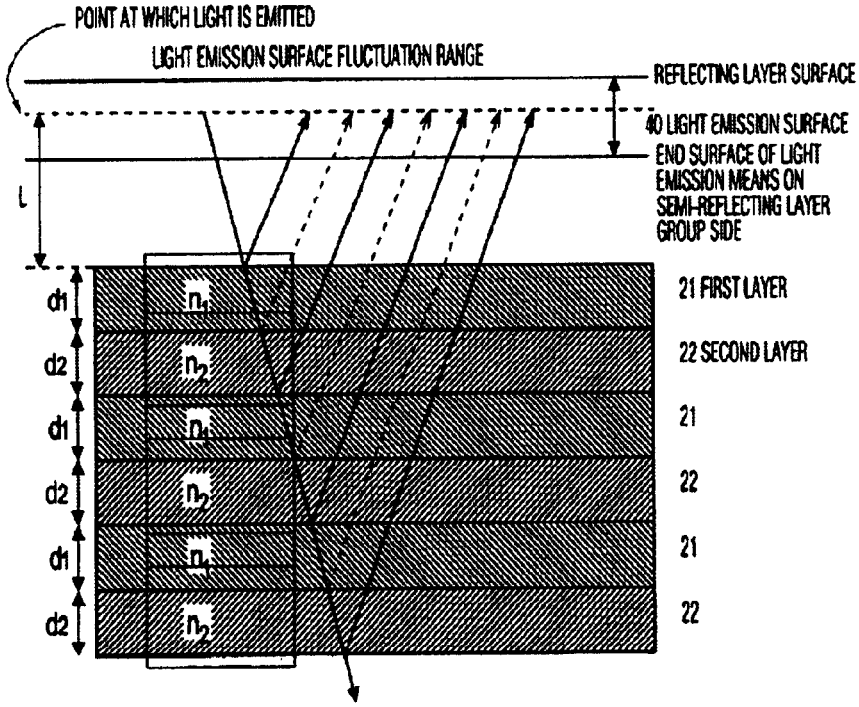
FIG. 2 is a diagram for explaining the interference conditions in a semi-reflecting layer.

FIG. 2 is a diagram for explaining the interference conditions together with an expanded view of the layer structure in the semi-reflecting layers. Each semi-reflecting layer is configured as an alternate stack of two layers having different refractive index, namely a first layer 21 and a second layer 22. In terms of the interference conditions as relating to the refractive index and thickness, adjustments are made so as to satisfy the relationship $$n1 \cdot d1 = n2 \cdot d2 = (1/4 + m/2) \cdot \lambda \qquad \text{Eq. 3}$$

where n1 is the refractive index of the first layer 21, d1 is the thickness thereof, n2 is the refractive index of the second layer 22, and d2 is the thickness thereof. Also, λ is the wavelength of light reflected in that semi-reflecting layer and m is an integer greater than 0. This corresponds to the half-wavelength of light in one two-layer combination. Reflection occurs when light from a layer of low refractive index is incident in a layer of high refractive index. Therefore it is desirable that the layers be stacked up, from the side toward the light emission means, as a high (refractive index) layer, low layer, high layer, low layer, etc.; set, in other words, so that $n1 > n2$ As to the specific materials used for the semi-reflecting layers 2R, 2G, and 2B, dielectric materials having differing refractive indexes are stacked up so as to satisfy the relationship represented in Equation 3. $TiO_2$ having a refractive index of 2.4 may be used for the first layer 21, for example, and $SiO_2$ having a refractive index of 1.44 as the second layer 22. Alternatively, ZnS having a refractive index of 2.37 may be used for the first layer 21, and $MgF_2$ having a refractive index of 1.38 as the second layer 22. The layers configuring the semi-reflecting layers are not limited to dielectric materials, however, and, for example, a laminar structure formed of resins or liquid crystals, as disclosed in Japanese Patent Laid-open No. H10-133222/1998, may be employed. In the semi-reflecting layers, the thicknesses of the first and second layers are adjusted to agree with the wavelength in that semi-reflecting layer. When the difference in refractive index is small between the first and second layers, the reflectance will decline, wherefore many layers are stacked up.

The positive electrode 3 is provided so as to exhibit light transmissivity. The material of the positive electrode is used as the positive electrode in an organic EL element, wherefore a metal, alloy, electrically conductive compound, or mixture thereof is used which exhibits a large work function (4 eV or greater). ITO is a preferable choice. If it is made thin to such degree that optical transmissivity can be secured, then other materials such as gold metal, CuI, $SnO_2$, and ZnO may be used. Here, the thickness of the positive electrode is adjusted for optical path length so that light resonates in each light emission region and so that light transmissivity is exhibited. With the optical path length, it is necessary to define two surfaces for causing light to resonate. One surface is a reflecting surface for the light from the light emitting layer side of the semi-reflecting layer that partially reflects light output from that light emission region. The other surface is variously altered by the morphology of the light emission means that contain the light emitting layer. Specifically, this surface will either be a surface that is perpendicular to the light axis and contains a point in the interval from the end of the light emitting layer on the semi-reflecting layer group side to the negative electrode surface (this surface hereinafter expressed by the term "light emitting surface") or the reflecting surface on the negative electrode side. In each drawing, the position of the other surface is shown at the interface between the negative electrode and light emitting layer. However, as noted above, these positions can be set in the interval from the surface of the light emitting layer (or hole transport layer in cases where such is provided) on the semi-reflecting layer group side to the negative electrode (reflecting layer). In the red light emission region $A_R$, the distance $L_R$ is adjusted so that the optical path distance between the boundary surface between the light emitting layer 4R and negative electrode, and the reflecting surface of the semi-reflecting layer 2R, satisfies the resonance conditions for red light. In the green light emission region $A_G$, the distance $L_G$ is adjusted so that the optical path distance between the boundary surface between the light emitting layer 4G and the negative electrode, and the reflecting surface of the semi-reflecting layer 2G, satisfies the resonance conditions for green light. And in the blue light emission region $A_B$, the distance $L_b$ is adjusted so that the optical path distance between the boundary surface between the light emitting layer 4B and the negative electrode, and the reflecting surface of the semi-reflecting layer 2B, satisfies the resonance conditions for green light.

Turning to the resonance conditions, as illustrated in FIG. 2, if λ is taken as the wavelength of the light that is output in that light emission region, then the distance L between the interface between the light emitting layer and the negative electrode, and the reflecting surface for the light from the light emitting layer of the semi-reflecting layer having a structure that reflects light of that wavelength λ is adjusted so as to satisfy the relationship $$L=\Sigma di$$

Eq. 1 (as above)

$$\Sigma(ni\cdot di)+m_1\cdot(\Phi/2\pi)\cdot\lambda=m_2\cdot\lambda 2$$

where ni is the refractive index of the i'th substance (including the dielectric layers in the semi-reflecting layers for other wavelengths) between the reflecting surface of that semi-reflecting layer and the light emitting surface 40, di is the thickness thereof, and $m_1$ and $m_2$ are natural numbers. When reflection is caused at the negative electrode surface, the phase shift that develops during reflection at the reflecting surface is given as Φ. Red light in the light emission region $A_R$ does not pass through the other semi-reflecting layer or layers along the way, wherefore adjustments are made so that the value of the product of the thickness and refractive index of the positive electrode 3 becomes a natural multiple of the half-wavelength.

As to the resonance conditions, as described in the foregoing, when a light emitting surface is set with one point in the light emitting layers 4R, 4G, and 4B as the light emission point, the distances L ($L_R$, $L_G$, $L_B$) between the reflecting surface on the light emitting layer side in the semi-reflecting layers 2R, 2G, and 2B that reflect light of wavelength λ and a point existing in interval from the end of the semi-reflecting layer side in the light emitting layers 4R, 4G, and 4B to the reflecting layer (that is, the interface between the light emitting layer 4 and negative electrode 5) is adjusted so as to satisfy the relationship $$L=\Sigma di$$

Eq. 2 (as above)

$$\Sigma(ni\cdot di)=m_2\cdot\lambda/2+(2m_3+1)\cdot\lambda/4$$

where ni is the refractive index of the i'th substance between the reflecting surface and the point, di is the thickness thereof, $m_2$ is a natural number, and $m_3$ is an integer greater than 0.

The light emitting layers 4R, 4G, and 4B are formed, respectively, of organic EL materials. The organic EL materials used emit light containing a relatively high amount of light components of wavelengths associated with the light emission regions. The light emitting surface changes depending on whether or not a charge transport layer exists, as will be described in conjunction with a subsequent embodiment. The thickness of each light emitting layer is determined according to the relationship between the negative electrode that is the reflecting surface and the light emission wavelength. For the material of the light emitting layer it is possible to employ materials being researched and developed as organic electroluminescence device materials, such as those set forth in Japanese Patent Laid-open No. 163967/1998 and Japanese Patent Laid-open No. 248276/1996. Specifically, the materials used for the red light emitting layer 4R include cyanopolyphenylene vinyline precursor, 2-1,3',4'-dihydroxyphenyl-3,5,7-trihydroxy-1-benzopolyriumperchlorate, or PVK doped with DCM1. The materials used for the green light emitting layer 4G include polyphenylene vinyline precursor, 2,3,6,7-tetrahydro-11-oxo-1H,5H,11H-(1)penzopyrano6,7,8-ij-quinolidine-10-carbonate, and PVK doped with quotamine 6. And the materials used for the blue light emitting layer 4B include aluminum quinolinol complex, pyrozoline dimer, 2,3,6,7-tetrahydro-9-methyl-11-oxo1H,5H,11H-(1) penzopyrano6,7,8-ij-quinolidine, distyro derivative, and PVK doped with 1,1,4,4-triphenyl-1,3-butadiene.

The negative electrode 5 functions as the negative electrode of the organic EL element, so a metal, alloy, electrically conductive compound, or mixture thereof having a small work function (4 eV or below) is used. It is particularly desirable, in the interest of enhancing the efficiency of the light emitting layer and causing the light to strongly resonate, that a material of high reflectance be used. Specifically, such substances include diamond, aluminum nitride, boron nitride, sodium, sodium-potassium alloys, magnesium, lithium, magnesium-copper mixtures, magnesium-silver mixtures, magnesium-aluminum mixtures, magnesium-indium mixtures, aluminum-aluminum oxide mixtures, indium, lithium-aluminum mixtures, and rare earth metals lithium fluride-aluminum, ie add flurides with A1 as either bilayer or Alloy.

In the configuration described above, when a certain voltage is applied across the positive electrode 3 and negative electrode 5, current flows to the light emitting layers, inducing an electro-luminescence effect, whereupon light containing wavelength components in the spectrum defined by the light emitting material is emitted on both sides of the layer. The light emitted on the side of the negative electrode 5 is reflected, interferes either with the direct light from the light emitting surface or with the light reflected on the negative electrode side, and is ejected to the ejection side (downward in FIG. 1). At this time, there is a refractive index differential in the dielectric layers configuring the semi-reflecting layer, wherefore reflection occurs at the interface of the dielectric layers having different refractive indexes. According to the interference conditions of Equation 3 exhibited by the dielectric layers, there is either a mutual canceling or mutual reinforcing effect, and only that light having the wavelength optimized in the dielectric material is reflected with high efficiency. This interferes with the light from the light emitting layer side, that is, with the light reflected by the negative electrode surface and the direct light from the light emitting layer, and only light having a wavelength that coincides with the resonance conditions expressed above in Equation 1 or 2, for example, resonates between the reflecting surface and the light emitting surface. As to the light having other wavelength components, when light from the light emitting layer is incident on the semi-reflecting layer corresponding to those wavelength components, the phase does not match and resonance does not occur, wherefore such light is relatively weakened. As a consequence, that wavelength spectrum is sharpened, and high-intensity light passes through the semi-reflecting layer and is ejected. The other semi-reflecting layers that do not match the resonance conditions function merely as semitransparent films, and the light attenuation and other effects resulting thereby are roughly the same in every wavelength domain. For this reason, light of a plurality of wavelengths, balanced in terms of intensity and color purity, will be output from each light emission region.

As based on the first embodiment described in the foregoing, resonance structures for each of three basic colors are stacked up, and resonance conditions are determined by adjusting the distance between the reflecting surface for light from the light emission means side of the semi-reflecting layers to a point existing in the interval from the end of the light emitting layer on the semi-reflecting layer side to the reflecting layer, wherefore it is possible to eject balanced light of a plurality of wavelengths.

As based on this embodiment, moreover, a semi-reflecting layer optimized for longer wavelengths is provided on the light emitting layer side, wherefore light can be emitted without affecting the light of other wavelengths.

As based on this embodiment, furthermore, an organic EL element is adopted as the light emission means, making it possible to select a material having suitable wavelength dispersion from among many different materials.

As based on this embodiment, moreover, the light emitting material is changed in light emission wavelength units, wherefore light of higher purity and intensity can be output.

As based on this embodiment, furthermore, the negative electrode is formed of a light-reflecting material, thus making it possible to effect resonance efficiently.

Embodiment 2

Figure 3:
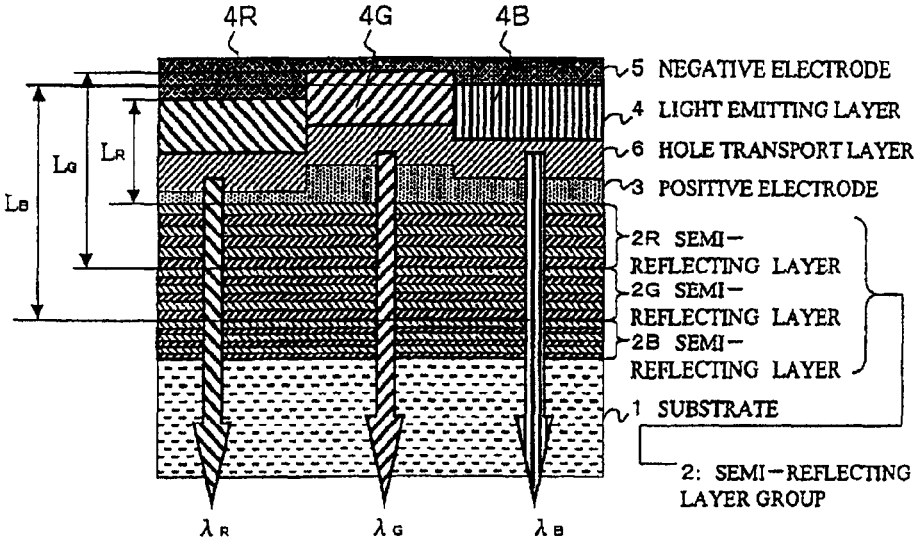
FIG. 3 is a cross-sectional diagram of the layer structure of a multiple wavelength light emitting device in a second embodiment of the present invention.

A second embodiment of the present invention pertains to a configuration wherein a hole transport layer is provided in the organic EL element of the first embodiment. In FIG. 3 is illustrated the layer structure of the multiple wavelength light emitting device of the second embodiment. This multiple wavelength light emitting device, as illustrated in FIG. 3, comprises a substrate 1, a semi-reflecting layer group 2, a positive electrode 3, a hole transport layer 6, a light emitting layer 4, and a negative electrode 5.

The hole transport layer 6, also called a hole injection layer, is made of an organic or inorganic material exhibiting either a hole injection function or an electron barrier-forming function. Materials disclosed in Japanese Patent Laid-open No. 163967/1988 or Japanese Patent Laid-open No. 248276/1996, for example, may be used. More specifically, the substances that may be used include triazole derivatives, oxadiazole derivatives, polyaryl alcane derivatives, pyrazoline derivatives, pyrazolone derivatives, phenylene diamine derivatives, arylamine derivatives, amino-substitution chalcone derivatives, oxazole derivatives, styrylanthracene derivatives, fluoronolene derivatives, hydrazone derivatives, stilbene derivatives, silazane derivatives, polysilane copolymers, aniline copolymers, and electrically conductive complex oligomers. The thickness thereof is made just sufficient to support the hole carrier function. However, when a hole transport layer is used, it is possible for the light emitting surface to be close to the interface between the hole transport layer 6 and the light emitting layer 4. Accordingly, in the interest of efficient light emission, thickness conditions are set for the light emitting layer and the hole transport layer such that mutual cancellation will not result from reflection by the negative electrode 5.

Other than this, the layer structure is the same as in the first embodiment and no further description is made here. When providing the hole transport layer, depending on the materials used in the light emitting layer and hole transport layer, the thicknesses thereof are adjusted so as to optimally obtain the desired wavelength characteristics.

As based on the second embodiment, in addition to realizing the same benefits as with the first embodiment, the addition of the hole transport layer enables the light emission efficiency of the organic EL element to be enhanced, resulting in an even brighter light emitting device.

Embodiment 3

Figure 4:
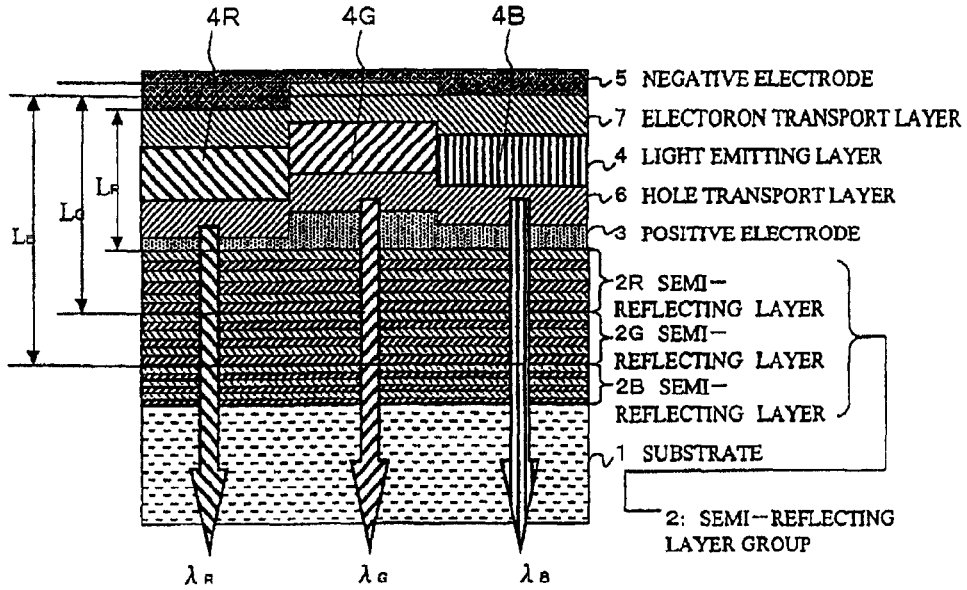
FIG. 4 is a cross-sectional diagram of the layer structure of a multiple wavelength light emitting device in a third embodiment of the present invention.

A third embodiment pertains to a configuration wherein an electron transport layer is provided in the organic EL element in the second embodiment. The layer structure of the multiple wavelength light emitting device in the third embodiment is illustrated in FIG. 4. As illustrated in FIG. 4, a substrate 1, a semi-reflecting layer group 2, a positive electrode 3, a hole transport layer 6, a light emitting layer 4, an electron transport layer 7, and a negative electrode 5 are provided.

The electron transport layer, also called an electron injection layer, has a function whereby it takes electrons injected from the negative electrode and conveys them efficiently to the light emitting layer. Materials disclosed in Japanese Patent Laid-open No. 163967/1988, Japanese Patent Laid-open No. 248276/1996 or Japanese Patent Laid-open No. 194393, for example, may be used. More specifically, the substances that may be used include nitro-substitution fluorolene derivatives, anthraquinodimethane derivatives, diphenylquinone derivatives, thiophan dioxide derivatives, naphthalene perilene and other heterocyclic tetracarbonate anhydrides, carbodiimide, freolenidine methan derivatives, anthraquinodimethanne and anthrolone derivatives, oxadiazole derivatives, and quinoxaline derivatives. The thickness thereof is made just sufficient to support the electron carrier function.

In other respects the layer structure is the same as in the second embodiment described above, so no further description is given here. However, the hole transport layer may be provided, or omitted, with the decision as to whether to provide it or not being based on a balance with the organic EL material.

As based on this third embodiment, in addition to realizing the same benefits as with the second embodiment described earlier, the addition of the electron transport layer enables the light emission efficiency of the organic EL element to be enhanced, resulting in an even brighter light emitting device.

Embodiment 4

Figure 5:
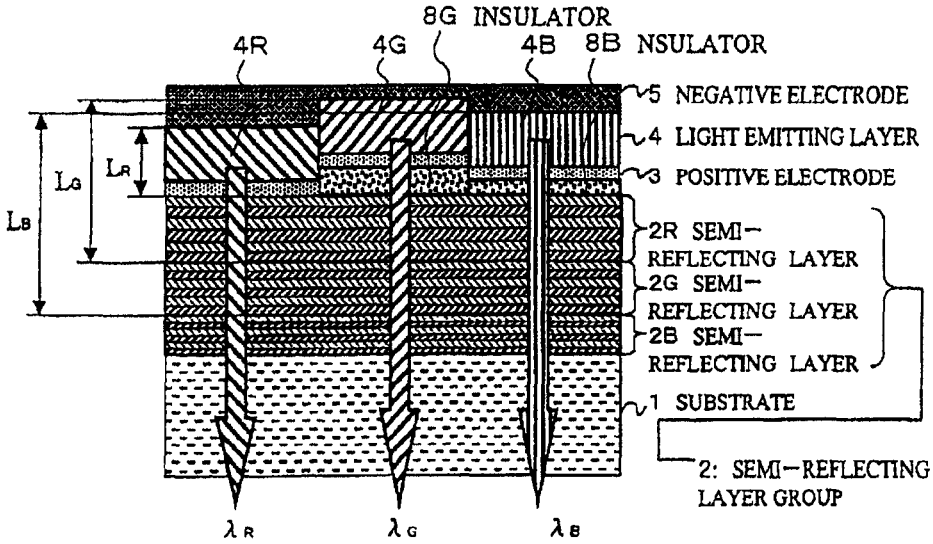
FIG. 5 is a cross-sectional diagram of the layer structure of a multiple wavelength light emitting device in a fourth embodiment of the present invention.

A fourth embodiment of the present invention pertains to a configuration wherein the adjustment of the optical path length that is a resonance condition in the organic EL element in the first embodiment is performed with insulators. In FIG. 5 is illustrated the layer structure of the multiple wavelength light emitting device in the fourth embodiment. This multiple wavelength light emitting device, as illustrated in FIG. 5, comprises a substrate 1, a semi-reflecting 2, a positive electrode 3, insulators 8G and 8B, a light emitting layer 4, and a negative electrode 5.

In this fourth embodiment, the positive electrode 3 is matched with the resonance conditions in the red light emission region $A_R$ and formed in the same thickness in the other light emission regions also. On the other hand, however, in the green light emission region $A_G$ and the blue light emission region $A_B$, respectively, insulators 8G and 8B are provided, in different thicknesses, so as to satisfy the resonance conditions in Equations 1 and 2. However, in this embodiment, all that has been done is to adjust the optical path length in order to cause resonance in the green and blue light emission regions, and an insulator may be placed in the red domain. The insulators 8G and 8B may be made of an organic or inorganic substance exhibiting light transmissivity. A dielectric such as $SiO_2$, $Si_3N_4$, or $TiO_2$ may be used, for example. However, there is a difference in refractive index between the dielectric and the positive electrode, wherefore the distances $L_G$ and $L_B$ from the semi-reflecting layers 2G and 2B to the light emitting surface will differ slightly from the first embodiment. In other respects the layer structure is the same as in the embodiments described earlier. When the charge carrier capability in the light emitting layer is low, moreover, a hole transport layer or an electron transport layer, or both, may be provided as in the second and third embodiments.

As based on this fourth embodiment, in addition to realizing the same benefits as in the embodiments described earlier, since the positive electrode can be formed with a uniform thickness, light emitting devices can be provided which are easier to fabricate when using a positive electrode material wherewith it is difficult to impart thickness differences.

Embodiment 5

Figure 6:
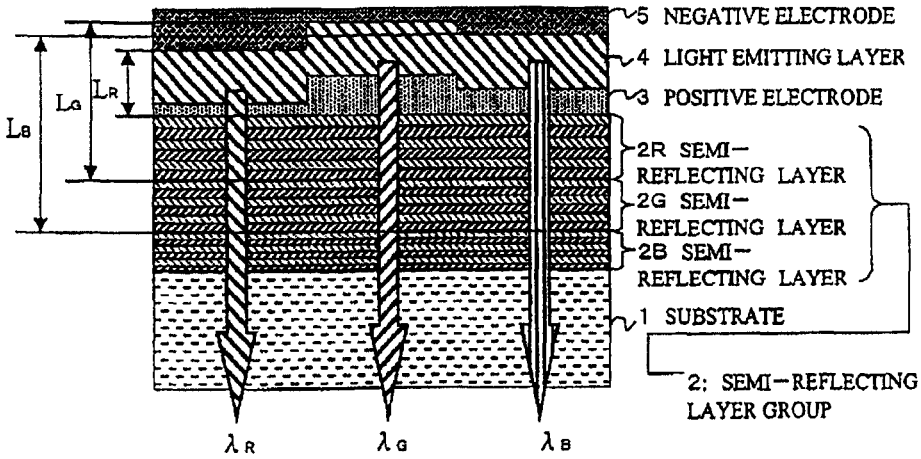
FIG. 6 is a cross-sectional diagram of the layer structure of a multiple wavelength light emitting device in a fifth embodiment of the present invention.

In the embodiments described above, a different light emitting layer is provided in each light emission region. In a fifth embodiment of the present invention, however, the same light emitting layer is provided for all of the light emission regions. In FIG. 6 is illustrated the layer structure of the multiple wavelength light emitting device in the fifth embodiment. This multiple wavelength light emitting device, as illustrated in FIG. 6, comprises a substrate 1, semi-reflecting layer group 2, positive electrode 3, light emitting layer 4, and negative electrode 5.

In this embodiment, the light emitting layer 4 is provided commonly for all of the light emitting layers. It is desirable that the light emitting layer be made of a wide-band light emitting material containing in good balance the wavelength components of the light supplied from the light emission regions in an intensity more than the predetermined level. The materials which may be used for this purpose include, for example, aluminum chelate ($Alq_3$) and polyparaphenylene vinyline. The distance between the reflecting surface of the semi-reflecting layer and the light emitting surface is considered to be the same as in the first embodiment. When the charge carrier capability in the light emitting layer is low, moreover, a hole transport layer or an electron transport layer, or both, may be provided as in the second and third embodiments. It is also permissible to adjust the optical path length with insulators as in the fourth embodiment. A diamine derivative (TAD) might be used for the hole transport layer used together with $Alq_3$.

In this configuration, light containing all of the wavelength components to be output is ejected from the light emitting layer 4. For this reason, in any of the semi-reflecting layers, light having a wavelength optimized for that reflecting layer will be reflected. However, the distance between the reflecting surface of the semi-reflecting layer and either the light emission point (light emitting surface) in the light emitting layer or the reflecting surface of the negative electrode is optimized so as to match the resonance conditions for a wavelength associated with each light emission region, wherefore only light having a wavelength within those resonance conditions is ejected with a sharpened spectrum.

As based on this fifth embodiment, in addition to realizing the same benefits as with the other embodiments, there is no need to fabricate a light emitting layer separately for each light emission region, wherefore manufacture is simplified.

Embodiment 6

Figure 7:
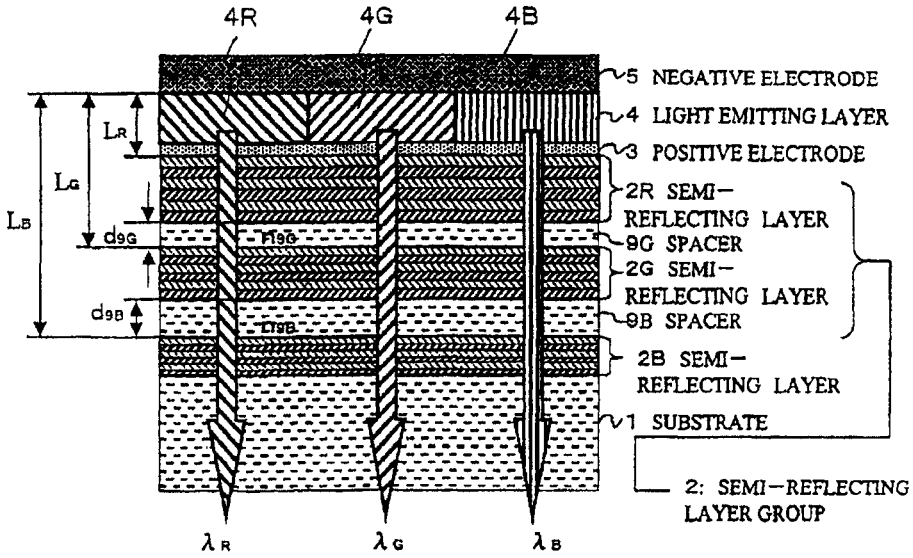
FIG. 7 is a cross-sectional diagram of the layer structure of a multiple wavelength light emitting device in a sixth embodiment of the present invention.

In the embodiments described in the foregoing, different resonance conditions are set for each light emission region with the positive electrode or insulators. In a sixth embodiment, however, the resonance conditions are altered while keeping the thickness of every layer uniform. In FIG. 7 is illustrated the layer structure of the multiple wavelength light emitting device of this sixth embodiment. This multiple wavelength light emitting device, as illustrated in FIG. 7, comprises a substrate 1, a semi-reflecting layer group 2 provided with spacers 9G and 9B, a positive electrode 3, a light emitting layer 4, and a negative electrode 5.

The spacers 9G and 9B are layers provided for adjusting the gaps between the semi-reflecting layers. These spacers should be made of a material such as a resin or dielectric that exhibits high light transmissivity and that bonds well with the semi-reflecting layers. If it is possible to maintain the distance between the semi-reflecting layers, needless to say, these layers may be configured of a gas, a liquid, or a liquid crystal, etc. The spacers 9G and 9B may be made of different materials having different refractive indexes. The materials for the light emitting layers are selected so that in the light emitting layer 2R in the red light emission region $A_R$ more red light wavelength components are present, so that in the light emitting layer 2G in the green light emission region $A_G$ more green light wavelength components are present, so that in the light emitting layer 2B in the blue light emission region $A_B$ more blue light wavelength components are present, and so that comparatively few other wavelength components are present. In this embodiment, the layer structure is the same in every light emission region, it being necessary to define the light emitting wavelength by the characteristics of the light emitting layer itself. In terms of resonance conditions, all of the light emission regions are set at uniform thickness with the positive electrode 5. That is, the optical path length between the light emitting surface of the light emitting layer 4R and the reflecting surface in the semi-reflecting layer 2R that is closest to the light emitting layer is maintained so as to correspond to a natural number multiple of the half-wavelength of the light (red light) reflected in that semi-reflecting layer. The thicknesses of the spacers 9G and 9B are adjusted so that the optical path length between the reflecting surface in the semi-reflecting layer 9G or 9B and the light emitting surface of the light emission means satisfies the resonance conditions expressed in Equation 2. More specifically, for the green light emission region $A_g$, an optical path length corresponding to the product of the refractive index $n_{9G}$ and the thickness $d_{9G}$ of the spacer 9G is added to Equation 2, and material having a refractive index so as to satisfy the resonance conditions is selected and the thickness set. And for the blue light emission region $A_B$, the optical path length $(n_{9G} \cdot d_{9G} + n_{9B} \cdot d_{9B})$ for both the spacer 9B and the spacer 9G is added to Equation 2, and material having a refractive index so as to satisfy the resonance conditions is selected and the thickness set. When the charge carrier capability in the light emitting layer is low, moreover, a hole transport layer or an electron transport layer, or both, may be provided as in the second and third embodiments.

In the configuration described in the foregoing, when light is ejected from the light emitting layer, for the red light semi-reflecting layer 2R closest to the light emitting layer, resonance and light emission occurs as in the first embodiment. For the other light emission regions also, since the optical path length thereof is adjusted so as to coincide with a natural number multiple of the half-wavelength, resonance occurs, and a sharpened spectrum of the resonant wavelength is output.

As based on this sixth embodiment, in addition to realizing the same benefits as in the other embodiments, the layers inclusive of the positive electrode and light emitting layer may all be formed flat and of uniform thickness, wherefore such complex process steps as patterning can be omitted and, hence, manufacturing costs reduced.

Embodiment 7

Figure 8:
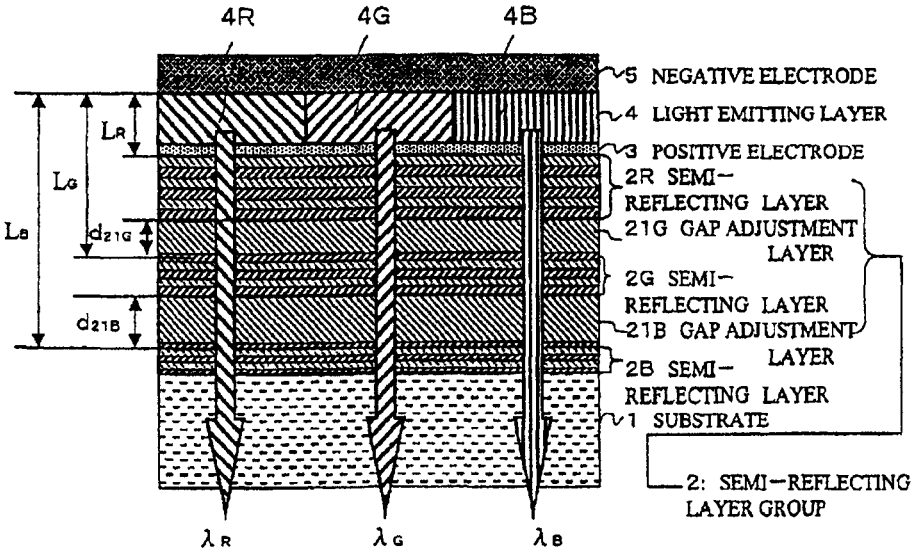
FIG. 8 is a cross-sectional diagram of the layer structure of a multiple wavelength light emitting device in a seventh embodiment of the present invention.

A seventh embodiment pertains to a modification of the gap adjustment method employed in the sixth embodiment. In FIG. 8 is illustrated the layer structure of the multiple wavelength light emitting device in this seventh embodiment. This multiple wavelength light emitting device, as illustrated in FIG. 8, comprises a substrate 1, a semi-reflecting layer group 2 equipped with gap adjustment layers 21G and 21B, a positive electrode 3, a light emitting layer 4, and a negative electrode 5.

The gap adjustment layer 21G is a layer for adjusting the gap between the semi-reflecting layers, altering the thickness of the first layer 21 that is the closest to the light emitting layer of the green semi-reflecting layers 2G. The gap adjustment layer 21B is a layer for adjusting the gap between the semi-reflecting layers, altering the thickness of the first layer 21 that is closest to the light emitting layer of the blue semi-reflecting layers 2B. Because the layers configuring the semi-reflecting layers are themselves dielectric materials, when the thickness of one layer is made different, that layer ceases to be a layer that produces interference, and, with the refractive index and thickness thereof, it will contribute to an increase in the optical path length given. More specifically, with respect to the green light emission region $A_G$, an optical path length corresponding to the product of the refractive index n1 and thickness $d_{21G}$ of the gap adjustment layer 21G is added to Equation 2, and material having a refractive index that satisfies the resonance conditions is selected and its thickness set. With respect to the light emission region $A_B$, an optical path length $n1 \cdot (d_{21G} + d_{21B})$ for both of the gap adjustment layers 21B and 21G is added to Equation 2, and material having a refractive index that satisfies the resonance conditions is selected and its thickness set.

In other respects the configuration is the same as in the sixth embodiment.

As based on this seventh embodiment, the gap is adjusted with the layer at the interface with the semi-reflecting layer, wherefore savings in materials used can be realized, and, when forming the gap adjustment layer in the process of fabricating the semi-reflecting layers, it is only necessary to control the film thickness, thus making it possible to reduce the number of manufacturing steps.

Embodiment 8

Figure 9:
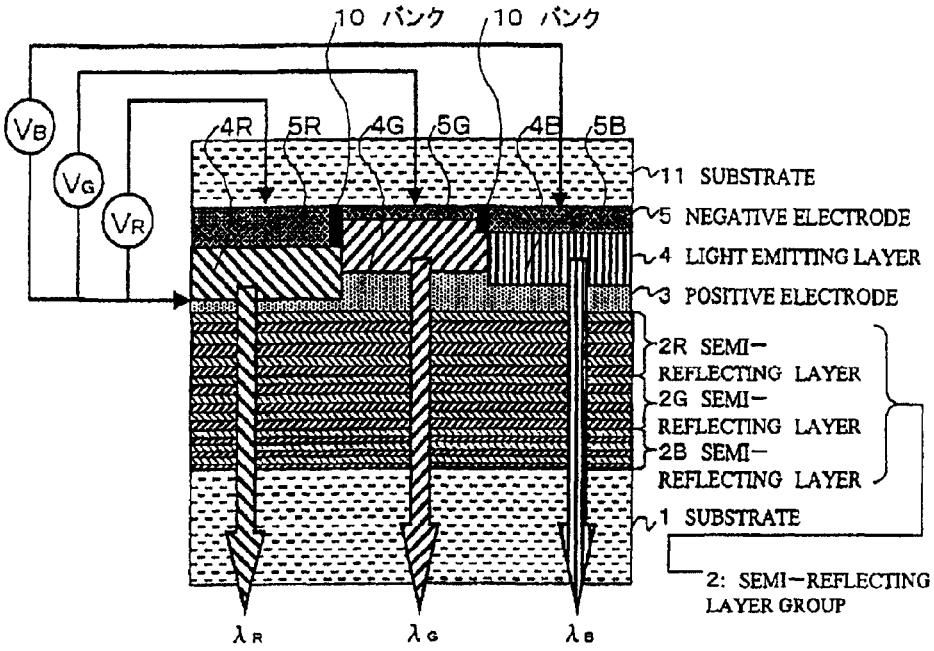
FIG. 9 is a cross-sectional diagram of the layer structure of a multiple wavelength light emitting device in an eighth embodiment of the present invention.

An eighth embodiment pertains to a structure wherewith it is possible to make a light emitting layer emit light in each light emission region. The layer structure of the multiple wavelength light emitting device in this eighth embodiment is illustrated in FIG. 9. This multiple wavelength light emitting device, as illustrated in FIG. 9, comprises a substrate 1, a semi-reflecting layer group 2, a positive electrode 3, a light emitting layer 4, an electrically divided negative electrode 5, a substrate 11, and banks 10. Also provided are drive circuits (not shown) for separately and independently applying control voltages $V_R$, $V_G$, and $V_B$, to the electrodes 5R, 5G, and 5B that are electrically separated by the banks 10, together with interconnecting wiring therefor.

In this embodiment, the banks 10 are provided at the interfaces of the light emission regions, with negative electrodes formed so that they are electrically separated in the domains partitioned by the banks. The substrate 11 is also provided for forming the banks 10 and the negative electrode patterns. A suitable material for the banks 10 would be polyimide, for example, or another organic or inorganic substance that is an insulator and that can be patterned and formed with a fixed height matched with the light emission region. In addition to electrically separating the negative electrode, as illustrated, the banks may also be formed so that they electrically separate the light emitting layer together with the negative electrode. When configured thusly, the layer structure corresponding to the organic EL element is sequentially formed on the base provided by the substrate 11. The substrate 11 need only exhibit mechanical strength and thermal strength. The drive circuits may be configured with TFTs, etc., so that they can drive each light emission region. Since the positive electrode is a common substrate, it forms an active matrix type of drive scheme. When the charge carrier capability in the light emitting layer is low, moreover, a hole transport layer or an electron transport layer, or both, may be provided as in the second and third embodiments. The positive electrode may also comprise a structure wherein insulators are stacked, as indicated in the fourth embodiment. The light emitting layers may all be provided commonly also, as in the fifth embodiment.

In the configuration described in the foregoing, when drive voltages $V_R$, $V_G$, and $V_B$ are applied so as to control the drive circuits in each light emission region, current flows only in the corresponding light emitting layer, and only the hue of that light emission region is output. If the light emission regions are formed so that they are associated with color pixels in a color display apparatus, and the drive voltage in each light emission region controlled with a correspondence established with RGB signals in color image data, the whole will function as a color display apparatus. In addition, the configuration is such as to permit the light emission color to be freely altered even when used as a light emitting device.

As based on the eighth embodiment described in the foregoing, the configuration is made so that the negative electrode is electrically separated into units that can be driven separately. Thus, in addition to realizing the benefits provided by the other embodiments, it is possible to make the multiple wavelength light emitting device of the present invention function as a display apparatus or other electronic apparatus.

Embodiment 9

Figure 10:
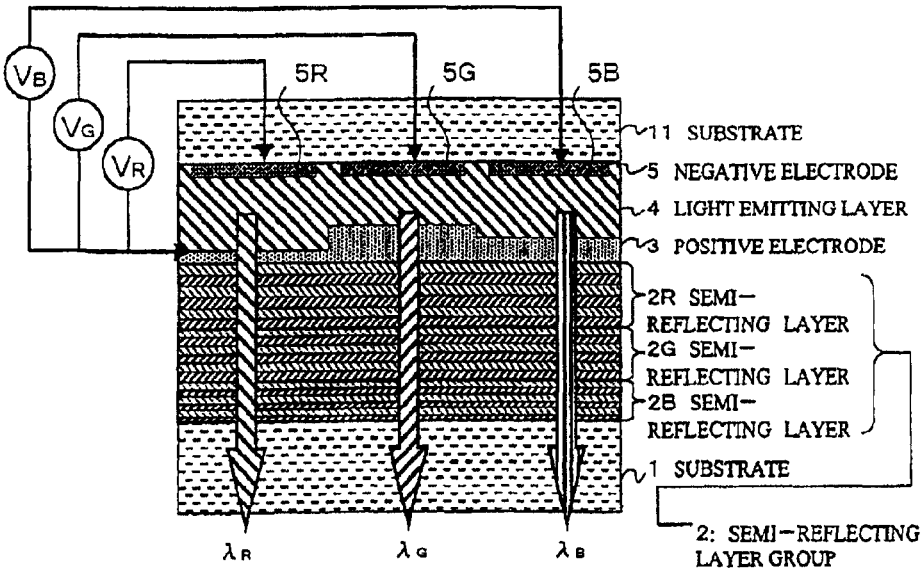
FIG. 10 is a cross-sectional diagram of the layer structure of a multiple wavelength light emitting device in a ninth embodiment of the present invention.

A ninth embodiment pertains to a modification of the eighth embodiment wherein the negative electrode is separated by patterning. The layer structure of the multiple wavelength light emitting device in this ninth embodiment is illustrated in FIG. 10. This multiple wavelength light emitting device, as illustrated in FIG. 10, comprises a substrate 1, a semi-reflecting layer group 2, a positive electrode 3, a light emitting layer 4, a patterned negative electrode 5, and a substrate 11. Also provided are drive circuits (not shown) for separately and independently applying control voltages $V_R$, $V_G$, and $V_B$, to the electrically separated negative electrodes 5R, 5G, and 5B, together with interconnecting wiring therefor.

In this embodiment, the negative electrode 5 is patterned in association with the light emission regions. The light emitting layer 4 is provided commonly for all of the light emission regions, as described in conjunction with the fourth embodiment. The material for the light emitting layer is the same as in the fourth embodiment. The substrate 11 is necessary when configuring the negative electrode by patterning so that it is electrically separated. In this embodiment also it is preferable that fabrication begin from the substrate 11. The drive circuits can separately and independently drive the electrically separated negative electrodes 5R, 5G, and 5B. In other respects the configuration is the same as in the first embodiment. If the positive electrode 3 is also patterned, and fashioned so as to configure the negative electrode 5 and matrix wiring, then this light emitting device can be driven as a passive matrix type of display apparatus.

In this configuration, when drive voltages $V_R$, $V_G$, and $V_B$ are applied to control the drive circuits for each light emitting domain, current flows only in the corresponding light emitting layer, and only the hue of that light emission region is output. If the light emission regions are formed so that they are associated with color pixels in a color display apparatus, and the drive voltage in each light emission region controlled with a correspondence established with RGB signals in color image data, the whole will function as a color display apparatus. In addition, the configuration is such as to permit the light emission color to be freely altered even when used as a light emitting device.

As based on the ninth embodiment described in the foregoing, the configuration is made so that the negative electrode is electrically separated into units that can be driven separately. Thus, in addition to realizing the benefits provided by the other embodiments, it is possible to provide a multiple wavelength light emitting device having a comparatively simple layer structure that can be easily fabricated.

Embodiment 10

Figure 11:
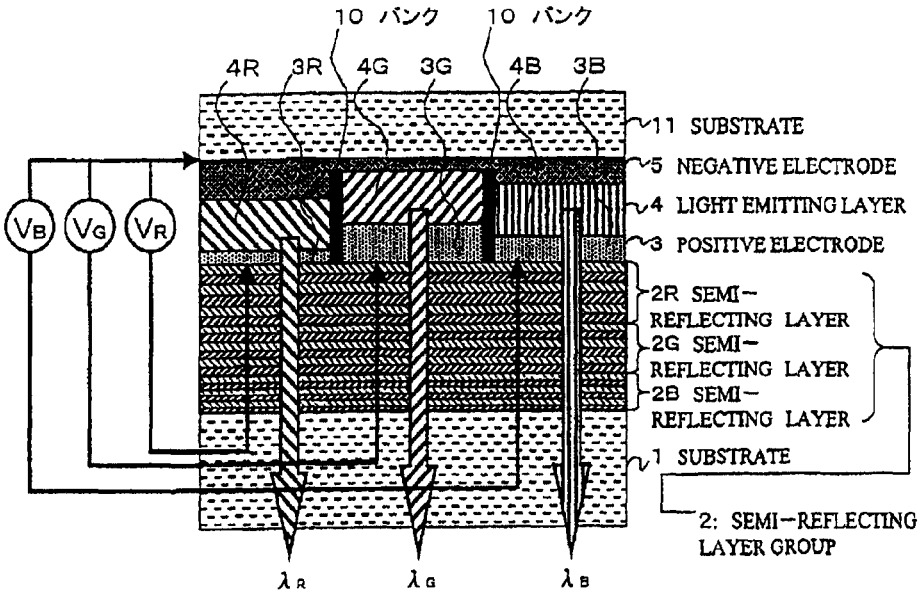
FIG. 11 is a cross-sectional diagram of the layer structure of a multiple wavelength light emitting device in a tenth embodiment of the present invention.

A tenth embodiment pertains to a configuration wherein, contrary to the eighth embodiment, the positive electrode is separated by banks. The layer structure of the multiple wavelength light emitting device in this tenth embodiment is illustrated in FIG. 11. This multiple wavelength light emitting device, as illustrated in FIG. 11, comprises a substrate 1, a semi-reflecting layer group 2, a positive electrode 3 separated by banks 10, a light emitting layer 4, a negative electrode 5, and a substrate 11. Also provided are drive circuits (not shown) for separately and independently applying control voltages $V_R$, $V_G$, and $V_B$, to the electrically separated positive electrodes 3R, 3G, and 3B, together with interconnecting wiring therefor.

In this embodiment, banks 10 are provided so that they can separate the light emitting layer and the positive electrode in each light emitting domain. The same materials and formation method can be used for the banks 10 and the substrate 11 as set forth in conjunction with the eighth embodiment. It is particularly desirable that the ink jet method set forth in Japanese Patent Laid-open No. H10-153967/1998 be used as the fabrication method for forming the banks on the substrate and pattern-forming the electrodes and light emitting layer. As to the drive scheme, when the negative electrode 5 is made a common electrode as in this embodiment, it is possible to provide a TFT on the side of the positive electrode 3, thereby permitting operation as an active matrix drive scheme. Also, by electrically separating the negative electrode side also, using banks and patterning, and forming a matrix-form electrode structure above and below the light emitting layer, it is possible to effect operation as a simple matrix drive scheme.

When the charge carrier capability in the light emitting layer is low, moreover, a hole transport layer or an electron transport layer, or both, may be provided as in the second and third embodiments, The positive electrode may also comprise a structure wherein insulators are stacked, as indicated in the fourth embodiment. The light emitting layers may all be provided commonly also, as in the fifth embodiment.

In this configuration, when drive voltages $V_R$, $V_G$, and $V_B$ are applied to control the drive circuits for each light emitting domain, current flows only in the corresponding light emitting layer, and only the hue of that light emission region is output. If the light emission regions are formed so that they are associated with color pixels in a color display apparatus, and the drive voltage in each light emission region controlled with a correspondence established with RGB signals in color image data, the whole will function as a color display apparatus. In addition, the configuration is such as to permit the light emission color to be freely altered even when used as a simple light emitting device.

As based on the tenth embodiment described in the foregoing, the configuration is made so that the positive electrode is electrically separated into units that can be driven separately. Thus, in addition to realizing the benefits provided by the other embodiments, it is possible to make the multiple wavelength light emitting device of the present invention function as a display apparatus or other electronic apparatus.

Embodiment 11

Figure 12:
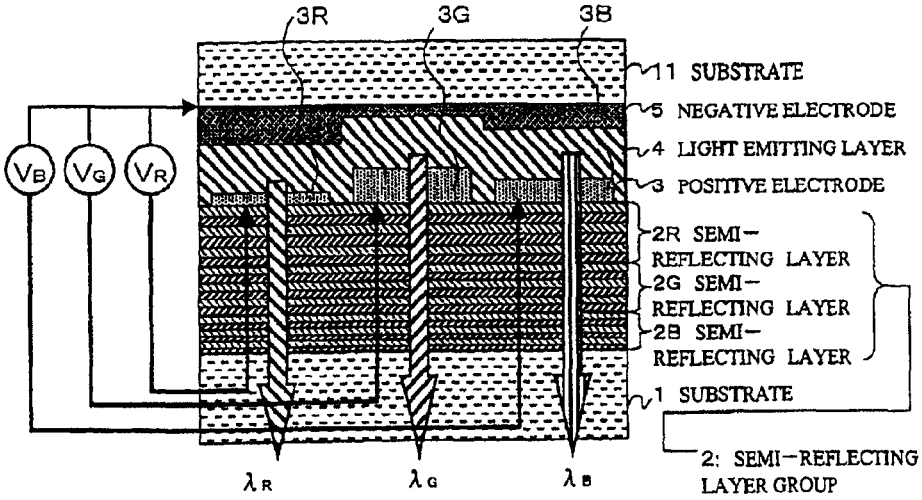
FIG. 12 is a cross-sectional diagram of the layer structure of a multiple wavelength light emitting device in an eleventh embodiment of the present invention.
Figure 13:
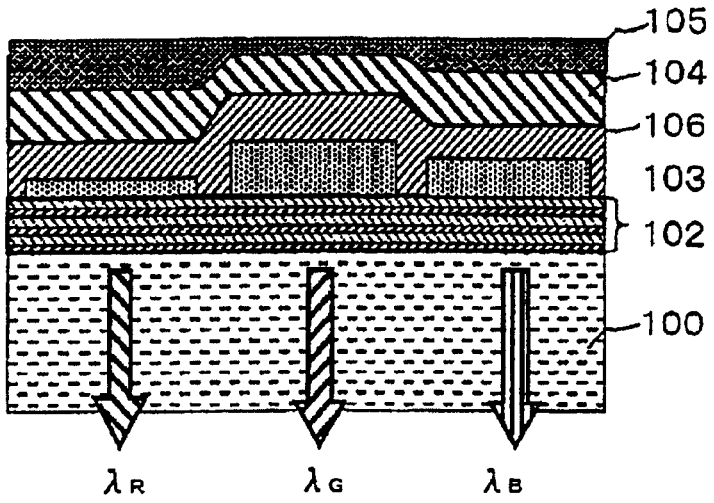
FIG. 13 is a cross-sectional diagram of the layer structure in a positive electrode gap adjustment type of light emitting device equipped with a conventional single semi-reflecting layer.
Figure 14:
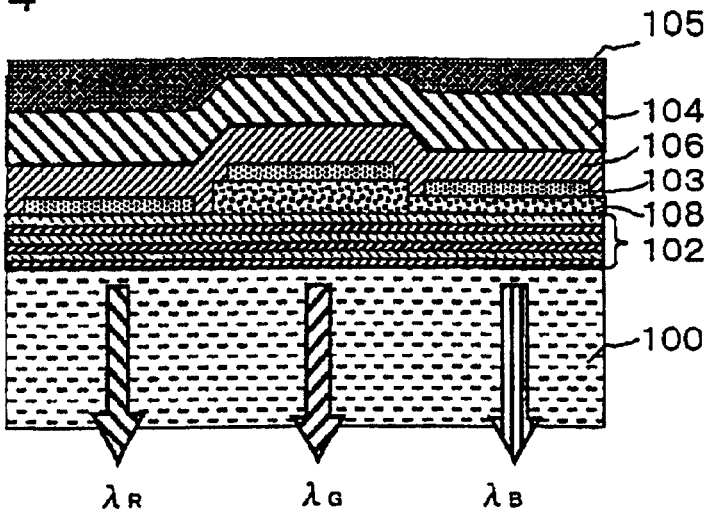
FIG. 14 is a cross-sectional diagram of the layer structure in a dielectric gap adjustment type of light emitting device equipped with a conventional single semi-reflecting layer.

An eleventh embodiment pertains to a modification of the tenth embodiment wherein the positive electrode is separated by patterning. The layer structure of the multiple wavelength light emitting device in this eleventh embodiment is illustrated in FIG. 12. This multiple wavelength light emitting device, as illustrated in FIG. 12, comprises a substrate 1, a semi-reflecting layer group 2, a patterned positive electrode 3, a light emitting layer 4, a negative electrode 5, and a substrate 11. Also provided are drive circuits (not shown) for separately and independently applying control voltages $V_R$, $V_G$, and $V_B$, to the electrically separated positive electrodes 3R, 3G, and 3B, together with interconnecting wiring therefor.

In this embodiment, the positive electrode 3 is patterned in association with the light emitting domains. The polarity of the drive circuits is opposite to the polarity in the eighth and ninth embodiments described earlier. The drive circuits, moreover, are fashioned so that they can individually and independently drive the electrically separated positive electrodes 3R, 3G, and 3B. In other respects, the configuration is the same as that of the eighth embodiment. In this embodiment, because the negative electrode side is not formed so as to be separate and independent, it is possible to form the laminar structure from the side of the semi-reflecting layer group 2. When forming the positive electrode 3, it is only necessary to perform patterning coordinated with the light emitting domains.

In this configuration, when drive voltages $V_R$, $V_G$, and $V_B$ are applied to control the drive circuits for each light emitting domain, current flows only in the corresponding light emitting layer, and only the hue of that light emission region is output. If the light emission regions are formed so that they are associated with color pixels in a color display apparatus, and the drive voltage in each light emission region controlled with a correspondence established with RGB signals in color image data, the whole will function as a color display apparatus. In addition, the configuration is such as to permit the light emission color to be freely altered even when used as a simple light emitting device.

As based on the eleventh embodiment described in the foregoing, the configuration is made so that the positive electrode is electrically separated into units that can be driven separately. Thus, in addition to realizing the benefits provided by the other embodiments, it is possible to provide a multiple wavelength light emitting device having a comparatively simple layer structure that can be easily fabricated.

Other Modifications

The present invention is not limited to or by the embodiments described in the foregoing, but may be configured in various suitable modifications so long as the scope of the basic concept thereof is not exceeded. The organic EL layer was used merely as representative of light emission means, for example, and some other known light emission means having a different structure may be used instead. As to the light emission effect, moreover, optical light emission may be used in addition to electric field light emission.

For the semi-reflecting layers, a multiple-layer dielectric film is used in the embodiments described in the foregoing, but this is not a limitation. It is also permissible to install a thin film or optical element functioning as a half mirror so that the resonance conditions are satisfied, or to use polarizing panels as the semi-reflecting layers while controlling the polarization.

There is also no limitation on the electronic apparatus in which the multiple wavelength light emitting device of the present invention may be applied. It may be employed in display or illumination devices in watches, calculators, portable telephones, pagers, electronic notebooks, notebook personal computers, and other portable information terminal apparatuses, as well as in camera viewfinders and large displays.

As based on the present invention, the configuration is made so that the wavelength output can be selected by adjusting the distance between the reflecting surface for light from the light emission means side of the semi-reflecting layer that partially reflects light output from the light emission region and a point existing in the interval from the end of the light emission means on the semi-reflecting layer group side to the reflecting layer, wherefore a multiple wavelength light emitting device can be provided wherewith light can be ejected that is optimized for any of a plurality of wavelengths.

As based on the present invention, the configuration is made so that the distance from the light emission means can be adjusted by the gap between the semi-reflecting layers. Therefore a multiple wavelength light emitting device can be provided wherewith optimization for a plurality of wavelengths is easy and which is easy to fabricate.

As based on the present invention, a multiple wavelength light emitting device is provided which outputs light of a plurality of optimized wavelengths, wherefore electronic apparatuss can be provided wherein the balance between light emission colors can be perfectly adjusted.

What is claimed is:

[1. A multiple wavelength light emitting device for emitting light of a plurality of differing wavelengths comprising:

light emission means for emitting light containing wavelength components to be output;

a reflecting layer placed in proximity to said light emission means;

a semi-reflecting layer group opposite said reflecting layer with said light emission means therebetween, the semi-reflecting layer group having semi-reflecting layers that reflect some light emitted from said light emission means having specific wavelengths and that transmit the remainder of the light emitted from said light emission means, stacked in order, in a direction of light advance so as to correspond with light wavelengths to be output; and two or more light emission regions wherein the wavelength of the output light differs wherein:

the distance between the reflecting layer for light from the light emission means side of the semi-reflecting layer group that partially reflects light output from that light emission region and a point at which light is emitted, existing in an interval from an end surface of said light emission means on the semi-reflecting layer group side to a surface of said reflecting layer, is adjusted so as to have an optical path length such that light of the wavelength output from that light emission region resonates, wherein said point in the interval from the end surface of said light emission means on the semi-reflecting layer group side to the surface of said reflecting layer is a light emission point in said light emission means.]

[2. A multiple wavelength light emitting device according to claim 1, wherein said semi-reflecting layer group has a plurality of types of semi-reflecting layers responsive to light of a plurality differing wavelengths that are placed uniformly without any separation between light emission regions.]

[3. A multiple wavelength light emitting device according to claim 1, wherein said reflecting surface for light from light emission means side of semi-reflecting layer in said semi-reflecting layer group is in a different position in thickness direction for each light emission region of different light emission wavelength.]

[4. A multiple wavelength light emitting device according to claim 1, wherein said point existing in interval from end of said light emission means on semi-reflecting layer group side to said reflecting layer is on reflecting surface of said reflecting layer.]

[5. A multiple wavelength light emitting device according to claim 4, wherein, in a light emission region that outputs light of wavelength λ, distance L between a reflecting surface for light from light emission means side of said semi-reflecting layer of said plurality of semi-reflecting layers that reflects light of wavelength λ and a point existing in interval from end of said light emission means on semi-reflecting layer group side thereof to said reflecting layer is adjusted so that $$L=\Sigma di$$

$$\Sigma(ni\cdot di)+m_1\cdot(\Phi/2\pi)\cdot=m_2\cdot\lambda/2$$

where ni is refractive index of i'th substance between said semi-reflecting layer and said light emitting surface, di is thickness thereof, Φ is phase shift occurring at said reflecting surface in said reflecting layer, and $m_1$ and $m_2$ are natural numbers.]

[6. A multiple wavelength light emitting device according to claim 1, wherein a point where an electric field becomes maximized between electrodes in an organic electro-luminescence layer coincides with said point at which light is emitted.]

[7. A multiple wavelength light emitting device according to claim 1, wherein, in a light emission region that outputs light of wavelength λ, distance L between a reflecting surface for light from light emission means side of said semi-reflecting layer of said plurality of semi-reflecting layers that reflects light of wavelength λ and a light emission point existing in interval from end of said light emission means on semi-reflecting layer group side thereof to said reflecting layer is adjusted so that $$L=\rho di$$

$$\Sigma(ni\cdot di)=m_2\cdot\lambda/2+(2m_3+1)\cdot\lambda/4$$

where ni is refractive index of the i'th substance between said reflective surface and said light emission point, di is thickness thereof, $m_2$ is a natural number, and $m_3$ is an integer greater than 0.]

[8. A multiple wavelength light emitting device according to claim 1, wherein, in said semi-reflecting layer group, said semi-reflecting layer that reflects light of longer wavelength is positioned on side nearer to said light emitting device.]

[9. A multiple wavelength light emitting device according to claim 1, wherein semi-reflecting layers configuring said semi-reflecting layer group are configured with two layers of different refractive index stacked alternately.]

[10. A multiple wavelength light emitting device according to claim 9, wherein said semi-reflecting layers are adjusted so as to satisfy the relationship $$n1\cdot d1=n2\cdot d2=(1/4+m/2)\cdot\lambda$$

where n1 is refractive index of one of said two layers having different refractive indexes, d1 is thickness thereof, n2 is refractive index of other layer, d2 is thickness thereof, λ is wavelength of light reflected in that semi-reflecting layer, and m is 0 or a natural number.]

[11. A multiple wavelength light emitting device according to claim 1, wherein said semi-reflecting layer group comprises gap adjustment layers, between semi-reflecting layers thereof, for adjusting distance between reflecting surface for light from said light emission means side of semi-reflecting layer other than that semi-reflecting layer closest to said light emission means and a point existing interval from end of said light emission means on semi-reflecting layer group side to said reflecting layer.]

[12. A multiple wavelength light emitting device according to claim 9, wherein, in order to adjust distance between reflecting surface for light from said light emission means said of semi-reflecting layer other than that semi-reflecting layer closest to said light emission means and a point existing in interval from end of said light emission means on semi-reflecting layer group side to said reflecting layer, thickness of one layer in laminar structure wherein said layers of different refractive index configure said semi-reflecting layers is altered.]

[13. A multiple wavelength light emitting device according to claim 1, wherein multiple types of light emission means for emitting a relatively large amount of light having light components of wavelengths corresponding to said light emission regions are provided so that they are associated with said light emission regions.]

[14. A multiple wavelength light emitting device according to claim 1, wherein light emission means capable of emitting light having wavelength components associated with all said light emission regions are provided commonly for all said light emission regions.]

[15. A multiple wavelength light emitting device according to claim 1, wherein said light emission means are an organic electro-luminescence layer sandwiched between electrode layers, and electrode provided on back side thereof corresponds to said reflecting layer.]

[16. A multiple wavelength light emitting device according to claim 15, wherein said light emission means comprise a hole transport layer on positive electrode side of said organic electro-luminescence layer.]

[17. A multiple wavelength light emitting device according to claim 15, wherein said light emission means comprises an electron transport layer on negative electrode side of said organic electro-luminescence layer.]

[18. A multiple wavelength light emitting device according to claim 15, wherein distance between reflecting surface for light from light emission means side of said semi-reflecting layers and a point existing in interval from end of said light emission means on semi-reflecting layer side thereof to said reflecting layer is adjusted with thickness of positive electrode positioned on semi-reflecting layer group side of said light emission means.]

[19. A multiple wavelength light emitting device according to claim 15, comprising a layer on semi-reflecting layer group side of said light emission means for purpose of adjusting distance between reflecting surface for light from light emission means side of said semi-reflecting layers and a point existing in interval from end of said light emission means on semi-reflecting layer side thereof to said reflecting layer.]

[20. A multiple wavelength light emitting device according to claim 15, wherein said negative electrode is made of a material exhibiting light reflectance.]

[21. A multiple wavelength light emitting device according to claim 15, wherein at least one of electrode films sandwiched around said organic electro-luminescence layer is formed separately and is independently, associated with said light emission regions.]

[22. A multiple wavelength light emitting device according to claim 21, wherein one or other of said electrode films is separated by a partition member that partitions said light emission regions from one another.]

[23. A multiple wavelength light emitting device according to claim 21, wherein, of said electrode films, the negative electrode is separated in association with said light emission regions, and thickness of said positive electrode is altered in association with said light emission regions in order to adjust distance between reflecting surface for light from light emission means side of said semi-reflecting layers and a point existing in interval from end of said light emission means on semi-reflecting layer side thereof to said reflecting layer.]

[24. A multiple wavelength light emitting device according to claim 21, wherein, of said electrode films, the positive electrode is separated in association with said light emission regions, and thickness thereof is altered in association with said light emission regions in order to adjust distance between reflecting surface for light from light emission means side of said semi-reflecting layers and a point existing in interval from end of said light emission means on semi-reflecting layer side thereof to said reflecting layer.]

[25. A multiple wavelength light emitting device according to claim 21, comprising drive circuits for individually driving said electrically separated electrode films.]

[26. An electronic apparatus comprising:

the multiple wavelength light emitting device claimed in claim 25.]

[27. A electronic apparatus according to claim 26, wherein said light emission regions in said multiple wavelength light emitting device are formed as pixels for displaying images, and function as display elements configured so that the driving of pixels can be controlled in response to image information.]

[28. An interference mirror comprising:

a plurality of interference reflecting layers, configured so that some light of mutually different wavelength can be reflected, positioned sequentially in the direction of the optical axis; and a plurality of gap adjacent layers, each of which has a different thickness with respect to one another, in the direction of the optical axis, positioned between said interference reflecting layers.]

*29. A multiple wavelength light emitting device that comprises a plurality of light emission regions that emit lights of wavelengths corresponding to mutually different colors, comprising:*

*a first light emission means provided in a first light emission region, the first light emission means emitting a first color light that has a first wave length;*

*a second light emission means provided in a second light emission region, the second light emission means emitting a second color light that has a second wave length which is different from the first wave length;*

*a reflecting layer placed opposite to the first and second light emission means;*

*a semi-reflecting layer group placed so as to be opposite to the first and second light emission means on a side opposite to the reflecting layer with respect to the first and second light emission means, and formed by stacking a first semi-reflecting layer and a second semi-reflecting layer, the first semi-reflecting layer having a first reflecting surface configured to reflect primarily the first color light emitted by the first light emission means, the second semi-reflecting layer having a second reflecting surface configured to reflect primarily the second color light emitted by the second light emission means;*

*a first distance between the first reflecting surface of the first semi-reflecting layer in the first light emission region and a first point in the first light emission means being a distance that resonates the first color light to be emitted by the first light emission region; and*

*a second distance between the second reflecting surface of the second semi-reflecting layer in the second light emission region and a second point in the second light emission means being a distance that resonates the second color light to be emitted by the second light emission region,*

*the first point existing in an interval from an end surface of the first light emission means on the semi-reflecting layer group side to a surface of the reflecting layer,*

*the second point existing in an interval from an end surface of the second light emission means on the semi-reflecting layer group side to the surface of the reflecting layer.*

*30. The multiple wavelength light emitting device according to claim 29, wherein the distance L between the first reflecting surface of the first semi-reflecting layer and the first point in the first light emission means is adjusted so that*

$$L=\Sigma di$$

$$\Sigma(ni\cdot di)=m_2\cdot\lambda/2+(2m_3+1)\cdot\lambda/4$$

*where λ is the wavelength, ni is refractive index of i'th substance between the first reflecting surface of the first semi-reflecting layer and the first point in the first light emission means, di is thickness of the i'th substance, $m_2$ is a natural number, and $m_3$ is an integer greater than 0.*

*31. The multiple wavelength light emitting device according to claim 29, wherein the semi-reflecting layer group comprises a gap adjustment layer between each of the first and second semi-reflecting layers for adjusting distance between the first reflecting surface for light from the first light emission means in a semi-reflecting layer other than that semi-reflecting layer closest to the first light emission means and the first point in the first light emission means.*

*32. The multiple wavelength light emitting device according to claim 31, wherein in order to adjust distance between a reflecting surface for light from the first light emission means side in a semi-reflecting layer other than that semi-reflecting layer closest to the first light emission means and the first point in the first light emission means, thickness of one layer in a laminar structure wherein the layers of different refractive index that configure the first and second semi-reflecting layers are altered.*

*33. The multiple wavelength light emitting device according to claim 29, wherein the first light emission means includes a luminescence layer provided between a first electrode provided on the semi-reflecting layer group side with respect to the first light emission means and a second electrode provided on a side opposite to the semi-reflecting layer group with respect to the first light emission means, and the second electrode corresponds to the reflecting layer.*

*34. The multiple wavelength light emitting device according to claim 33, wherein in the first light emission means, a point where an electric field becomes maximized between the first electrode and the second electrode and the first point in the first light emission means coincide.*

*35. The multiple wavelength light emitting device according to claim 34, wherein one of the first electrode or the second electrode is formed separately and independently associated with each of the plurality of light emission regions.*

*36. The multiple wavelength light emitting device according to claim 33 wherein the distance between the first reflecting surface of the first semi-reflecting layer and the first point in the first light emission means is adjusted with thickness of the first electrode.*

*37. The multiple wavelength light emitting device according to claim 36, wherein one of the first electrode or the second electrode is formed separately and independently associated with each of the plurality of light emission regions.*

*38. The multiple wavelength light emitting device according to claim 33, comprising a layer on the semi-reflecting layer group side of said first light emission means for purpose of adjusting the distance between the first reflecting surface of the first semi-reflecting layer and the first point in the first light emission means.*

*39. The multiple wavelength light emitting device according to claim 38, wherein one of the first electrode or the second electrode is formed separately and independently associated with each of the plurality of light emission regions.*

*40. The multiple wavelength light emitting device according to claim 33, wherein the first electrode is separated in association with the first and second light emission regions, and the distance between the first reflecting surface of the first semi-reflecting layer and the first point in the first light emission means is adjusted by thickness of the first electrode.*

*41. The multiple wavelength light emitting device according to claim 40, comprising drive circuits for individually driving the first electrode or the second electrode.*

*42. The multiple wavelength light emitting device according to claim 33, wherein the second electrode is separated in association with the first and second light emission regions, and the distance between the first reflecting surface of the first semi-reflecting layer and the first point in the first light emission means is adjusted by thickness of the first electrode.*

*43. The multiple wavelength light emitting device according to claim 42, comprising drive circuits for individually driving the first electrode or the second electrode.*

*44. The multiple wavelength light emitting device according to claim 33, wherein one of the first electrode or the second electrode is formed separately and independently associated with each of the plurality of light emission regions.*

*45. The multiple wavelength light emitting device according to claim 29 wherein, in the semi-reflecting layer group, the first and second semi-reflecting layers are placed successively over the plurality of light emission regions.*

*46. The multiple wavelength light emitting device according to claim 29, wherein the first light emission means includes a luminescence layer, and the luminescence layer is provided discretely for each of the plurality of light emission regions.*

*47. The multiple wavelength light emitting device according to claim 29, wherein the first light emission means includes a luminescence layer, and the luminescence layer is provided commonly for the plurality of light emission regions.*

*48. A display comprising a multiple wavelength light emitting device claimed in claim 29.*

*49. An electric apparatus comprising a multiple wavelength light emitting device claimed in claim 29.*

*50. The electronic apparatus according to claim 49, wherein the plurality of light emission regions are formed as pixels for displaying images, and function as display elements configured so that the driving of pixels can be controlled in response to image information.*

* * * * *